(12) United States Patent
Sakakura

(10) Patent No.: US 8,188,741 B2
(45) Date of Patent: May 29, 2012

(54) MAGNETIC RESONANCE IMAGING APPARATUS AND CHILLER

(75) Inventor: Yoshitomo Sakakura, Nasushiobara (JP)

(73) Assignees: Kabushiki Kaisha Toshiba, Minato-Ku, Tokyo (JP); Toshiba Medical Systems Corporation, Otawara-Shi, Tochigi (JP)

( * ) Notice: Subject to any disclaimer, the term of this patent is extended or adjusted under 35 U.S.C. 154(b) by 231 days.

(21) Appl. No.: 12/521,831

(22) PCT Filed: Feb. 25, 2009

(86) PCT No.: PCT/JP2009/053447
§ 371 (c)(1),
(2), (4) Date: Jun. 30, 2009

(87) PCT Pub. No.: WO2009/113397
PCT Pub. Date: Sep. 17, 2009

(65) Prior Publication Data
US 2010/0315086 A1 Dec. 16, 2010

(30) Foreign Application Priority Data
Mar. 13, 2008 (JP) .................................. 2008-064589

(51) Int. Cl.
*G01V 3/00* (2006.01)
(52) U.S. Cl. ...................................................... 324/318
(58) Field of Classification Search ........... 324/300–322
See application file for complete search history.

(56) References Cited

U.S. PATENT DOCUMENTS

| 6,516,282 B2 * | 2/2003 | Hedlund et al. ............... 702/132 |
| 6,909,283 B2 * | 6/2005 | Emeric et al. .................. 324/300 |
| 6,992,483 B1 * | 1/2006 | Emeric et al. .................. 324/300 |
| 7,301,343 B1 * | 11/2007 | Sellers ........................... 324/318 |
| 7,868,617 B2 * | 1/2011 | Seeber et al. .................. 324/318 |

FOREIGN PATENT DOCUMENTS

| JP | 11-173691 A | 7/1999 |
| JP | 11-244255 A | 9/1999 |
| JP | 2005-279168 A | 10/2005 |
| JP | 2006-311957 | 11/2006 |
| JP | 2007-143865 A | 6/2007 |
| JP | 2008-149144 A | 7/2008 |

OTHER PUBLICATIONS

International Search Report and Written Opinion mailed Apr. 7, 2009 in PCT/JP2009/053447 with English translation.

* cited by examiner

*Primary Examiner* — Dixomara Vargas
(74) *Attorney, Agent, or Firm* — Nixon & Vanderhye PC

(57) ABSTRACT

By using a temperature monitor, a coil-dedicated chiller measures an amount of change in temperature of cooling water flowing out from a cooling pipe of a gradient magnetic field, determines an amount of change in temperature of cooling water to be flowed into the cooling pipe in accordance with the measured amount of change in temperature of the cooling water; and changes the temperature of cooling water to be flowed into the cooling pipe of the gradient magnetic field based on the determined amount of change in temperature.

20 Claims, 11 Drawing Sheets

MAGNETIC RESONANCE IMAGING APPARATUS AND CHILLER

This application is the U.S. national phase of international Application No. PCT/JP2009/053447, filed 25 Feb. 2009, which designated the U.S. and claims priority to Japanese Application No. 2008-064589 filed 13 Mar. 2008, the entire contents of each of which are hereby incorporated by reference.

TECHNICAL FIELD

The present invention relates to a magnetic resonance imaging apparatus that takes an image of an inside of a subject by using a magnetic resonance phenomenon, and a chiller; and particularly relates to a technology for cooling a gradient magnetic-field coil that generates heat in accordance with a pulse sequence during a scan.

BACKGROUND ART

Conventionally, a magnetic resonance imaging apparatus (hereinafter, referred to as "MRI (Magnetic Resonance Imaging) apparatus") is an apparatus that takes an image of the inside of a subject by using a magnetic resonance phenomenon, and includes various units for performing a scan, such as a static magnetic-field magnet that generates a static magnetic field in a scan region, a gradient magnetic-field coil that applies a gradient magnetic field to the subject, and a radio-frequency coil that receives a magnetic resonance signal from the subject who is applied with the gradient magnetic field.

Some of such units generate heat during a scan. Particularly, the gradient magnetic-field coil remarkably generates heat during a scan because a pulse current is repeatedly supplied in accordance with a pulse sequence. For this reason, an MRI apparatus usually includes a chiller for cooling a gradient magnetic-field coil. The chiller includes, for example, a heat exchanger or a circulation pump, and cools the gradient magnetic-field coil by circulating a coolant, such as water, through a cooling pipe that is provided to the gradient magnetic-field coil (for example, see Patent Document 1).

The gradient magnetic-field coil is sometimes provided with an iron shim for correcting ununiformity in a static magnetic field inside a scan region in some cases. When the temperature of the gradient magnetic-field coil varies, magnetic permeability of the iron shim changes due to an influence of a variation in the temperature. When the magnetic permeability of the iron shim changes, a change appears in static magnetic field uniformity in the scan region, and particularly change in the center frequency is remarkable.

It is known that a variation in the center frequency can be an obstacle to fat suppression or a cause of an artifact in an image. Therefore, to obtain an image of stable quality, it is required to suppress variations in the temperature of the gradient magnetic-field coil. Usually an MRI apparatus suppresses variations in the temperature of a gradient magnetic-field coil by detecting the temperature of the gradient magnetic-field coil by using a temperature sensor, and changing the flow rate of a coolant to be flowed into a cooling pipe in accordance with a detected temperature change.

Patent Document 1: JP-A 2006-311957 (KOKAI)

In addition to a gradient magnetic-field coil, some of units included in an MRI apparatus, such as a static magnetic-field magnet and a gradient magnetic-field amplifier (G-amplifier), need to be cooled, and such units are each to be cooled by a chiller similarly to the gradient magnetic-field coil. FIG. 12 is a schematic diagram for explaining cooling of units of an MRI apparatus according to the conventional technology.

For example, as shown in the figure, it is assumed that the MRI apparatus includes a gradient magnetic-field coil, a unit A, and a unit B, as units each of which needs to be cooled. In such case, the gradient magnetic-field coil, the unit A, and the unit B are each provided with a cooling pipe through which a coolant, such as water, is circulated. The cooling pipe of each of the units is connected to a chiller that is placed, for example, outdoors, and a coolant at a constant temperature (for example, 20° C.) is circulated by the chiller. Each of the units is then cooled by circulating the coolant inside the unit through the cooling pipe.

As described above, according to the conventional MRI apparatus, a chiller for cooling units that need to be cooled is often shared among the units in many cases. Consequently, when the flow rate of the coolant is changed to stabilize the temperature of the gradient magnetic-field coil, the temperature of the other units of which temperature does not need to be changed also changes correspondingly, thereby influencing functions of the units.

A cooling pipe for circulating a coolant is usually made from metal, such as copper, as a material; however, when the flow rate of the coolant flowing through the pipe is changed, erosion of an inner wall of the cooling pipe progresses more quickly, as a result, the life of the cooling pipe becomes shorter.

For such reasons, in order to obtain a stable quality as a primary purpose, it is required to suppress variations in the temperature of the iron shim without changing the flow rate of a coolant to be flowed into the cooling pipe.

BRIEF SUMMARY

The present exemplary embodiment has been made to solve a problem according to the conventional technology as described above, and an object of the present exemplary embodiment is to provide a magnetic resonance imaging apparatus and a chiller both of which can suppress variations in the temperature of an iron shim without changing the flow rate of a coolant to be flowed into a cooling pipe.

To solve the above problems and to achieve the objects, according to one aspect of the present exemplary embodiment, a magnetic resonance imaging apparatus includes a gradient magnetic-field coil that applies a gradient magnetic field to a subject placed in a static magnetic field, a chiller that circulates a coolant at least in the gradient magnetic-field coil, a temperature-change measuring unit that measures an amount of change in temperature per unit of time of a coolant flowing out from the gradient magnetic-field coil, a temperature control unit that determines an amount of change in temperature of a coolant flowing into the gradient magnetic-field coil in accordance with the amount of change in temperature of the coolant measured by the temperature-change measuring unit, and a temperature adjusting unit that changes temperature of a coolant flowing from the chiller into the gradient magnetic-field coil in accordance with the amount of change in temperature determined by the temperature control unit.

According to another aspect of the present exemplary embodiment, a chiller includes a temperature-change measuring unit that measures an amount of change in temperature per unit of time of a coolant flowing out from a gradient magnetic-field coil of a magnetic resonance imaging apparatus, a temperature control unit that determines an amount of change in temperature of a coolant flowing into the gradient magnetic-field coil in accordance with the amount of change in temperature of the coolant measured by the temperature-change measuring unit, and a temperature adjusting unit that changes temperature of a coolant flowing into the gradient magnetic-field coil in accordance with the amount of change in temperature determined by the temperature control unit, and flows the coolant of which temperature is changed into the gradient magnetic-field coil.

According to the present exemplary embodiment, variations in the temperature of a gradient magnetic-field coil can be suppressed without changing the flow rate of a coolant to be flowed into a cooling pipe.

DETAILED EXPLANATION OF EXEMPLARY EMBODIMENTS

EXPLANATIONS OF LETTERS OR NUMERALS

Figure 1:
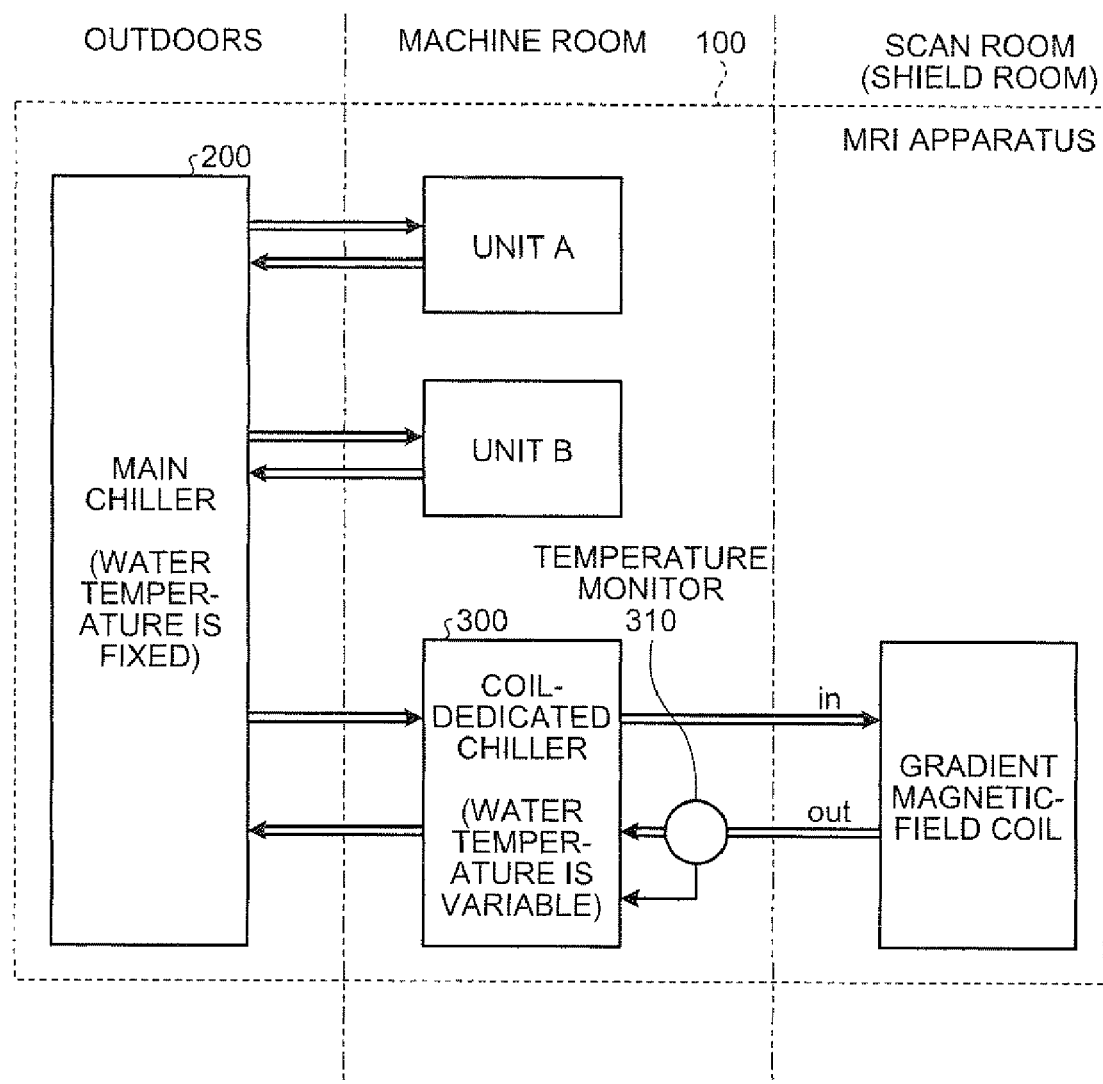
FIG. 1 is a schematic diagram for explaining cooling of units of an MRI apparatus according to a first embodiment.

100 MRI apparatus (Magnetic Resonance Imaging Apparatus)
10 static magnetic-field magnet
11 vacuum container
12 superconducting coil
20 gradient magnetic-field coil
21 main coil
22 shield coil
23 shim-tray insertion guide
24 shim tray
25 iron shim
26 cooling pipe
30 RF coil
40 top plate
50 gradient magnetic-field power source
60 transmitting unit
70 receiving unit
80 sequence control device
90 computer system
200, 400 main chiller
300, 500, 600 coil-dedicated, chiller
310 temperature monitor
320 temperature-change measuring unit
330 temperature control unit
340 temperature adjusting unit
610, 620, 630 solenoid valve Exemplary embodiments of an MRI apparatus and a chiller will be explained below in detail with reference to the accompanying drawings. Although the embodiments described below are explained in a case where water (hereinafter, referred to as "cooling water") is used as a coolant to be circulated in a cooling pipe, the embodiments are not limited this, and can be similarly applied to a case of using another kind of coolant.

First Embodiment

First of all, cooling of units in an MRI apparatus according to a first embodiment is explained below. FIG. 1 is a schematic diagram for explaining cooling of units of an MRI apparatus according to a first embodiment. An MRI apparatus 100 according to the first embodiment includes various kinds of units required for taking an image of the inside of a subject by using magnetic resonance phenomenon. For example, as shown in FIG. 1, the MRI apparatus 100 includes a gradient magnetic-field coil, a unit A, and a unit B.

It is assumed that the gradient magnetic-field coil, the unit A, and the unit B generate heat during a scan, therefore, need to be cooled. For this reason, the gradient magnetic-field coil, the unit A, and the unit B are each provided with a cooling pipe for circulating cooling water. Furthermore, the MRI apparatus 100 includes a main chiller 200, and a coil-dedicated chiller 300, as chillers for cooling the gradient magnetic-field coil, the unit A, and the unit B.

According to the first embodiment, the gradient magnetic-field coil is placed in a scan room; the unit A, the unit B, and the coil-dedicated chiller 300 are placed in a machine room; and the main chiller 200 is placed outdoors. It is assumed that the scan room is a so-called shield room, which is formed by using a shield that shields Radio Frequency (RF) signals from the outside.

The main chiller 200 is a device that circulates cooling water in cooling pipes provided to the gradient magnetic-field coil, the unit A, and the unit B included in the MRI apparatus 100. The main chiller 200 circulates cooling water at a constant temperature (for example, 20° C.) through the cooling pipe of each unit. The main chiller 200 circulates cooling water via the coil-dedicated chiller 300 into the cooling pipe of the gradient magnetic-field coil.

The coil-dedicated chiller 300 is a device that is connected to a cooling pipe provided to the gradient magnetic-field coil included in the MRI apparatus 100, and circulates cooling water in the cooling pipe. The coil-dedicated chiller 300 is configured to flow cooling water supplied from the main chiller 200 into the cooling pipe of the gradient magnetic-field coil, and to return cooling water flowing out from the cooling pipe of the gradient magnetic-field coil to the main chiller 200.

According to the first embodiment, the coil-dedicated chiller 300 includes a temperature monitor 310, and is configured to measure the amount of change in temperature of cooling water flowing out from the cooling pipe of the gradient magnetic-field coil ("out" shown in the figure) by using the temperature monitor 310, and to change the temperature of cooling water to be flowed into the cooling pipe of the gradient magnetic-field coil ("in" shown in the figure) in accordance with the measured amount of change.

For example, when the temperature of cooling water flowing out from the cooling pipe of the gradient magnetic-field coil rises, the coil-dedicated chiller 300 determines that heat generation by the gradient magnetic-field coil is increased, and then decreases the temperature of cooling water to be flowed from the main chiller 200 into the cooling pipe of the gradient magnetic-field coil by an amount corresponding to the amount of a rise in the temperature. By contrast, when the temperature of cooling water flowing out from the cooling pipe of the gradient magnetic-field coil decreases, the coil-dedicated chiller 300 determines that heat generation by the gradient magnetic-field coil is decreased, and then raises the temperature of cooling water to be flowed from the main chiller 200 into the cooling pipe of the gradient magnetic-field coil by an amount corresponding to the amount of a decrease in the temperature.

In this way, according to the first embodiment, as the coil-dedicated chiller 300 appropriately changes the temperature of cooling water to be flowed into the cooling pipe of the gradient magnetic-field coil in accordance with the amount of change in temperature of cooling water flowing out from the cooling pipe of the gradient magnetic-field coil, variations in the temperature of the gradient magnetic-field coil can be suppressed without changing the flow rate of cooling water to be flowed into the cooling pipe.

Figure 2:
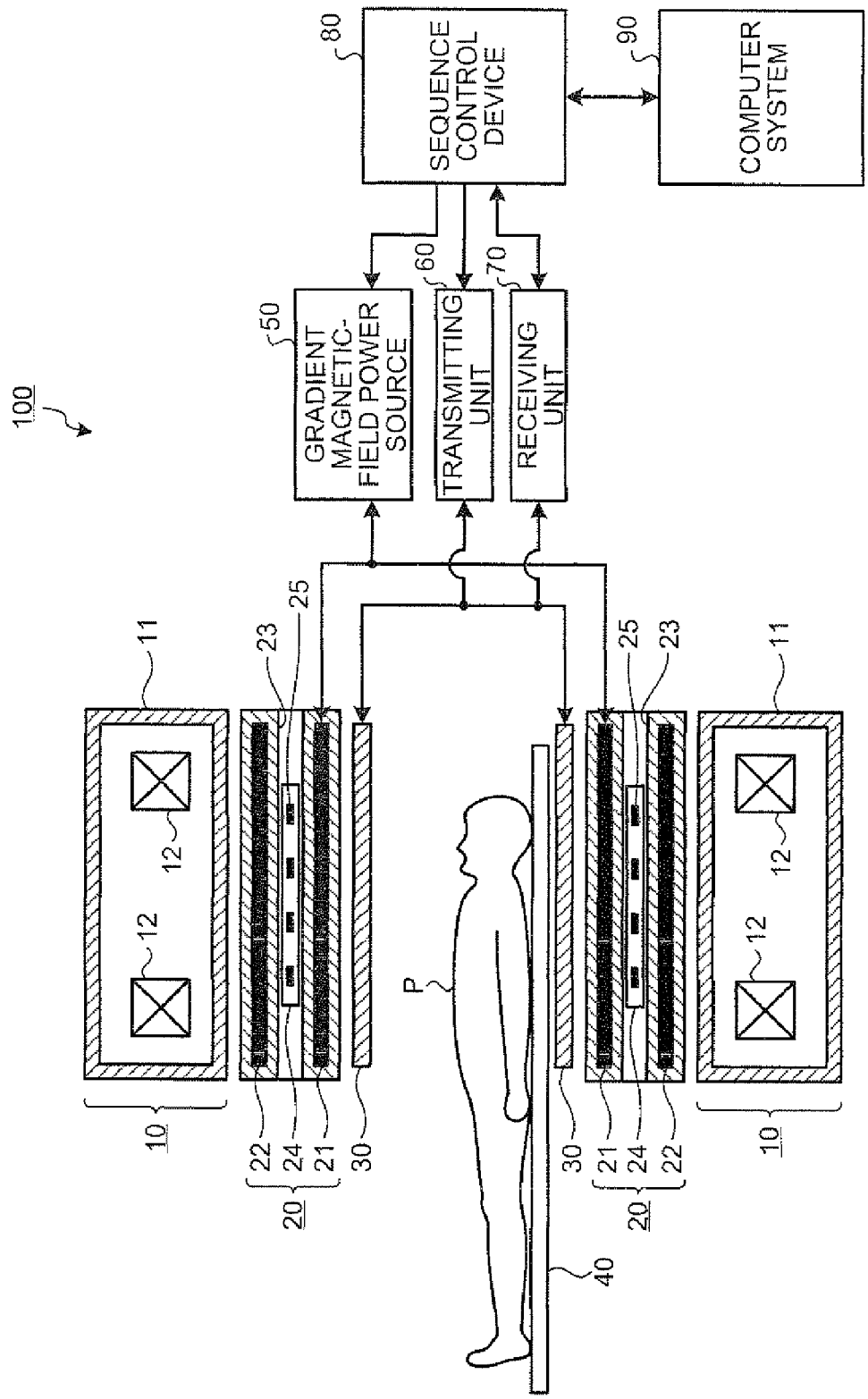
FIG. 2 is a configuration diagram that depicts a configuration of the MRI apparatus according to the first embodiment.

A configuration of the MRI apparatus 100 according to the first embodiment is explained below. FIG. 2 is a configuration diagram that depicts a configuration of the MRI apparatus 100 according to the first embodiment. As shown in the figure, the MRI apparatus 100 includes a static magnetic-field magnet 10, a gradient magnetic-field coil 20, an RF coil 30, a top plate 40, a gradient magnetic-field power source 50, a transmitting unit 60, a receiving unit 70, a sequence control device 80, and a computer system 90.

The static magnetic-field magnet 10 includes a vacuum container 11 that is substantially in a drum shape, and superconducting coils 12 that are immersed in a cooling liquid in the vacuum container 11, and generate a static magnetic field inside a bore (a space inside the drum of the static magnetic-field magnet 10), which is a scan region.

The gradient magnetic-field coil 20 is substantially in a drum shape, and anchored inside the static magnetic-field magnet 10. The gradient magnetic-field coil 20 includes a main coil 21 that applies a gradient magnetic field in directions of an x-axis, a y-axis, and a z-axis with a current supplied from the gradient magnetic-field power source 50, and a shield coil 22 that cancels a magnetic field leaked from the main coil 21.

A shim-tray insertion guide 23 is formed between the main coil 21 and the shield coil 22. A shim tray 24 that accommodates iron shims 25 for correcting ununiformity of a magnetic field inside the bore is to be inserted into the shim-tray insertion guide 23. A structure of the gradient magnetic-field coil 20 will be explained later in detail.

The RF coil 30 is anchored inside the gradient magnetic-field coil 20 on opposite sides of a subject P. The RF coil 30 irradiates the subject P with an RF pulse transmitted from the transmitting unit 60, and receives a magnetic resonance signal emitted from the subject P by excitation of hydrogen nuclei.

The top plate 40 is provided to be capable to move horizontally to a not-shown bed, the subject P is to be placed on the top plate 40 during a scan, and then the top plate 40 is to be moved into the bore. The gradient magnetic-field power source 50 is a power source that supplies power to the gradient magnetic-field coil 20 based on an instruction from the sequence control device 80.

The transmitting unit 60 is a device that transmits an RF pulse to the RF coil 30 based on an instruction from the sequence control device 80. The receiving unit 70 detects a magnetic resonance signal received by the RF coil 30, and transmits raw data obtained by digitizing the detected magnetic resonance signal to the sequence control device 80.

The sequence control device 80 is a device that performs a scan of the subject P by activating the gradient magnetic-field power source 50, the transmitting unit 60, and the receiving unit 70, under the control of the computer system 90. As a result of performing a scan, when raw data is transmitted from the receiving unit 70, the sequence control device 80 transmits the raw data to the computer system 90.

The computer system 90 is a device that controls the whole of the MRI apparatus 100, and includes an input unit that receives various input from an operator; a sequence control unit that causes the sequence control device 80 to execute a scan based on scanning conditions input by the operator; an image reconstructing unit that reconstructs an image based on raw data transmitted from the sequence control device 80; a storage unit that stores, for example a reconstructed image; a display unit that displays various information, such as a reconstructed image; a main control unit that controls operation of each functional unit based on an instruction from the operator, and the like.

Figure 3:
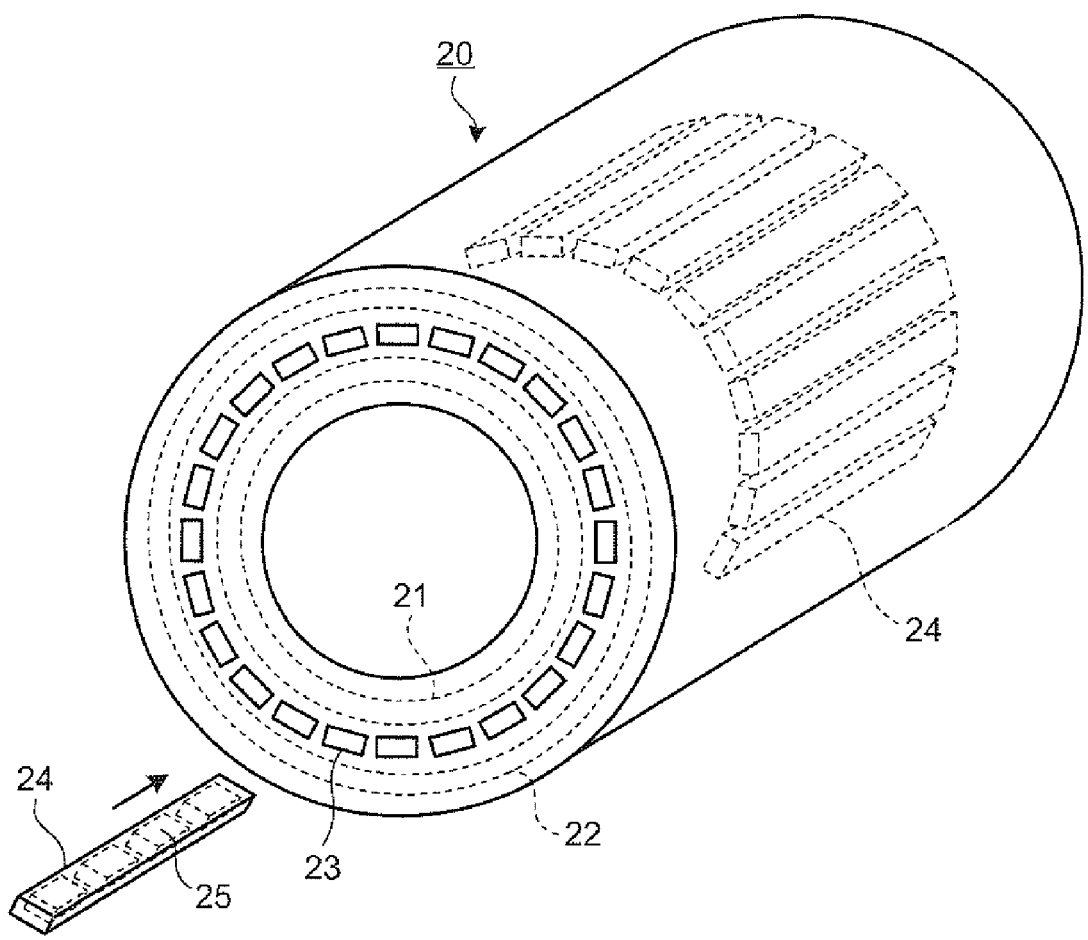
FIG. 3 is a perspective view that depicts a structure of a gradient magnetic field.

A configuration of the gradient magnetic-field coil 20 shown in FIG. 2 is explained below in detail. FIG. 3 is a perspective view that depicts a structure of the gradient magnetic-field coil 20. As shown in the figure, the gradient magnetic-field coil 20 includes the main coil 21 that is substantially in a drum shape, and the shield coil 22. The shim-tray insertion guides 23 are formed between the two coils.

Each of the shim-tray insertion guides 23 is a through hole that has openings at both ends of the gradient magnetic-field coil 20, and is formed along the whole length in the longitudinal direction of the gradient magnetic-field coil 20. The shim-tray insertion guides 23 are formed so as to be in parallel with each other with regular intervals in the circumferential direction in a region between the main coil 21 and the shield coil 22. The shim tray 24 is inserted in each of the shim-tray insertion guides 23.

Each of the shim trays 24 is manufactured from a resin that is a non-magnetic and nonconductive material, and formed substantially in a stick shape. Each of the shim trays 24 accommodates a certain number of the iron shims 25. Each of the shim trays 24 is inserted into each of the shim-tray insertion guides 23, and anchored in the central part of the gradient magnetic-field coil 20.

Figure 4:
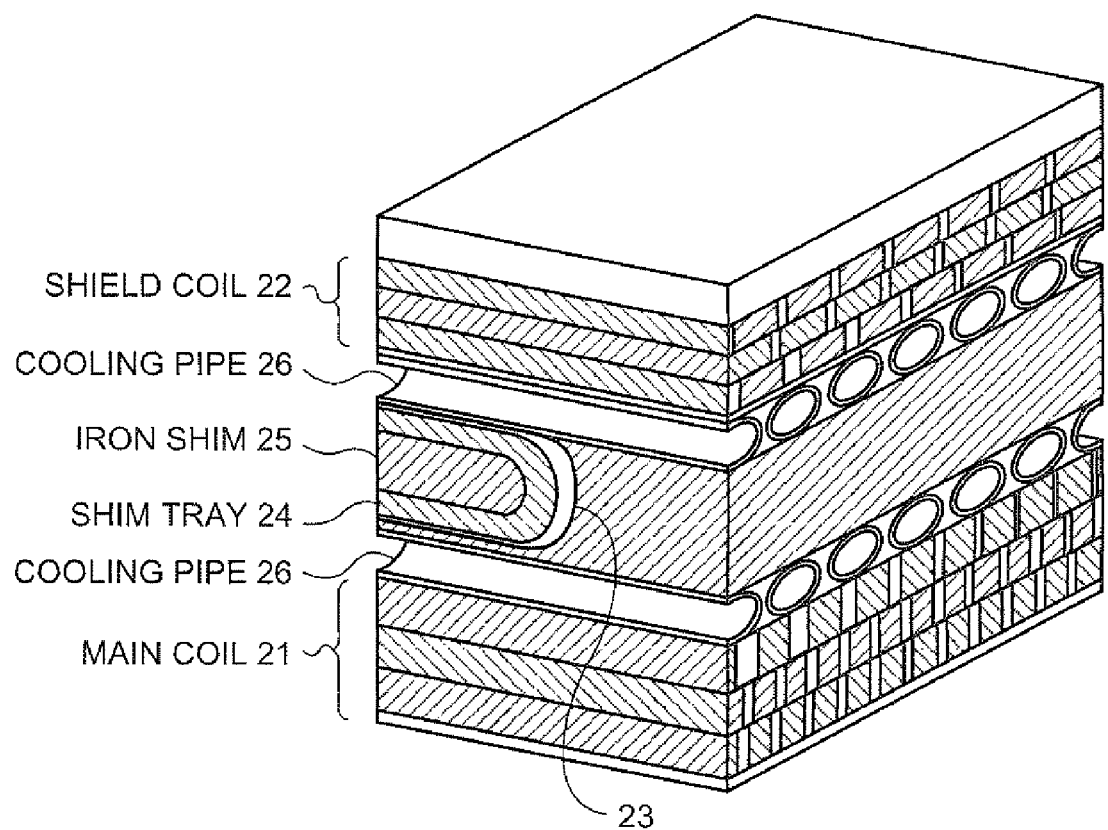
FIG. 4 is a structure diagram that depicts an internal structure of the gradient magnetic-field coil.

Moreover, a cooling pipe is embedded in the gradient magnetic-field coil 20 spirally along the drum shape, although it is not shown in FIG. 3. FIG. 4 is a structure diagram that depicts an internal structure of the gradient magnetic-field coil 20. The figure depicts part of the gradient magnetic-field coil 20, the upper part of the figure depicts the outer side of the drum shape, and the lower part depicts the inner side of the drum shape.

As shown in the figure, a cooling pipe 26 is spirally embedded in the gradient magnetic-field coil 20 inside and outside the shim-tray insertion guides 23, namely, between the shim-tray insertion guides 23 and the main coil 21, and between the shim-tray insertion guides 23 and the shield coil 22. Cooling water sent from the coil-dedicated chiller 300 flows into the cooling pipe 26, the flowing-in cooling water circulates inside the gradient magnetic-field coil 20 through the cooling pipe 26, and then flows out to the outside of the gradient magnetic-field coil 20. In this way, cooling water cools the gradient magnetic-field coil 20 by circulating inside the gradient magnetic-field coil 20 through the cooling pipe 26.

Figure 5:
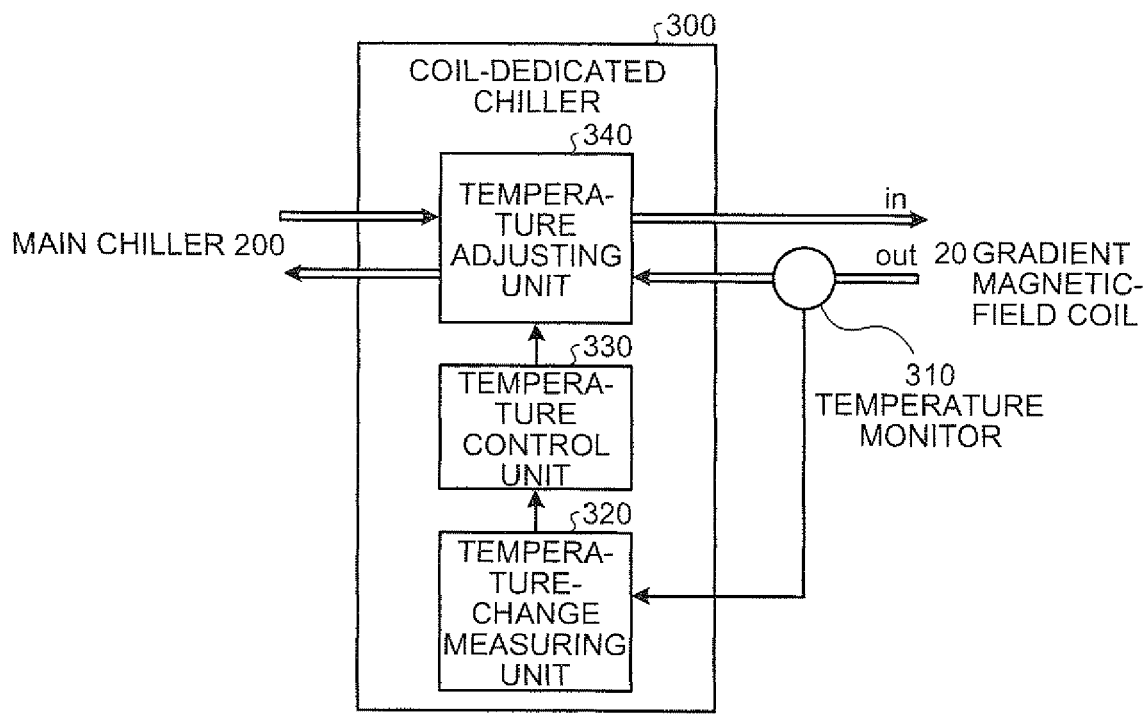
FIG. 5 is a functional diagram that depicts a configuration of a coil-dedicated chiller according to the first embodiment.

A configuration of the coil-dedicated chiller 300 according to the first embodiment is explained below. FIG. 5 is a functional diagram that depicts a configuration of the coil-dedicated chiller 300 according to the first embodiment. As shown in the figure, the coil-dedicated chiller 300 includes the temperature monitor 310, a temperature-change measuring unit 320, a temperature control unit 330, and a temperature adjusting unit 340.

The temperature monitor 310 is a device that detects the temperature of cooling water flowing out from the cooling pipe of the gradient magnetic field coil 20 ("out" shown in the figure). The temperature monitor 310 constantly or regularly gives notice of the detected temperature to the temperature-change measuring unit 320, which will be described later.

The temperature-change measuring unit 320 is a processing unit that measures the amount of change in temperature of cooling water flowing out from the cooling pipe of the gradient magnetic-field coil 20. Specifically, the temperature-change measuring unit 320 measures an amount of change $T_{out}$ (=dTemp/dtime) in temperature per unit of time of cooling water flowing out from the cooling pipe of the gradient magnetic-field coil 20, based on the temperature notified from the temperature monitor 310; and then gives notice of the measured amount of change $T_{out}$ to the temperature control unit 330, which will be described later.

The temperature control unit 330 is a corresponding unit that determines the amount of change in temperature of cooling water to be flowed into the cooling pipe of the gradient magnetic-field coil 20 in accordance with the amount of change in temperature of the cooling water measured by the temperature-change measuring unit 320. Specifically, when being notified of the amount of change $T_{out}$ in temperature by the temperature-change measuring unit 320, the temperature control unit 330 calculates an amount of change $T_{in}$ in temperature per unit of time of cooling water to be flowed into the cooling pipe of the gradient magnetic-field coil 20, based on the notified amount of change $T_{out}$; and gives notice of the calculated amount of change $T_{in}$ to the temperature adjusting unit 340, which will be described later.

The temperature control unit 330 calculates the amount of change $T_{in}$, for example, in accordance with Equation (1) as follows:

$$T_{in}=A*T_{out} \quad (1)$$

According to Equation (1) described above, A is a predetermined constant. The constant A is basically set to a negative value, for example, −5.

Accordingly, for example, if the amount of change $T_{out}$ in temperature notified from the temperature-change measuring unit 320 is 0.5° C./unit time, which means that the temperature of cooling water flowing out from the cooling pipe of the gradient magnetic-field coil 20 rises by 0.5° C./unit time, the amount of change $T_{in}$ in temperature of cooling water to be flowed into the cooling pipe of the gradient magnetic-field coil 20 is to be $T_{in}$=0.5[° C.]*(−5)=−2.5[° C.].

If the amount of change $T_{out}$ in temperature notified from the temperature-change measuring unit 320 is −1° C./unit time, which means that the temperature of cooling water flowing out from the cooling pipe of the gradient magnetic-field coil decreases by 1° C./unit time, the amount of change $T_{in}$ in temperature of cooling water to be flowed into the cooling pipe of the gradient magnetic-field coil 20 is to be $T_{in}$=−1[° C.]*(−5)=+5[° C.].

The temperature adjusting unit 340 is a device that changes the temperature of cooling water to be flowed into the cooling pipe of the gradient magnetic-field coil 20 based on the amount of change in temperature determined by the temperature control unit 330, and can be implemented, for example, by using a heat exchanger.

Specifically, when being notified of the amount of change $T_{in}$ in temperature by the temperature control unit 330, the temperature adjusting unit 340 changes the temperature of cooling water supplied from the main chiller 200 such that the temperature changes by the amount of change $T_{in}$ per unit of time. The temperature adjusting unit 340 then flows the cooling water of which temperature is changed into the cooling pipe of the gradient magnetic-field coil 20.

Figure 6:
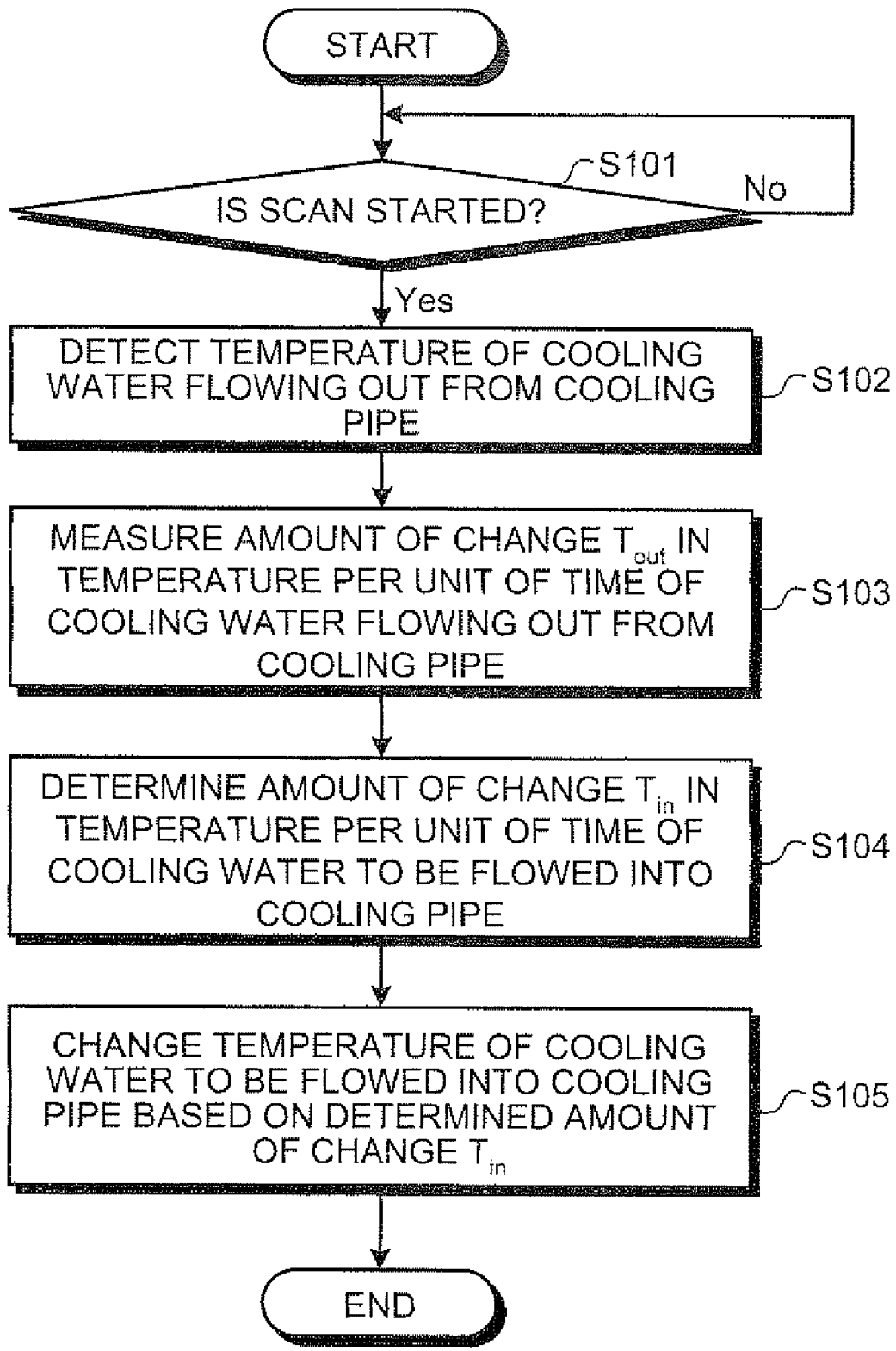
FIG. 6 is a flowchart that describes a process procedure by the coil-dedicated chiller according to the first embodiment.

A process procedure by the coil-dedicated chiller 300 according to the first embodiment is explained below. FIG. 6 is a flowchart that describes a process procedure by the coil-dedicated chiller 300 according to the first embodiment. As shown in the figure, according to the coil-dedicated chiller 300, when the MRI apparatus 100 starts a scan (Yes at Step S101), the temperature monitor 310 detects the temperature of cooling water flowing out from the cooling pipe of the gradient magnetic-field coil 20 (Step S102).

The temperature-change measuring unit 320 then measures the amount of change $T_{out}$ in temperature per unit of time of the cooling water flowing out from the cooling pipe of the gradient magnetic-field coil 20, based on the temperature detected by the temperature monitor 310 (Step S103).

Subsequently, the temperature control unit 330 determines the amount of change $T_{in}$ in temperature per unit of time of cooling water to be flowed into the cooling pipe of the gradient magnetic-field coil 20 in accordance with the amount of change $T_{out}$ in temperature of the cooling water measured by the temperature-change measuring unit 320 (Step S104).

The temperature adjusting unit 340 then changes the temperature of cooling water supplied from the main chiller 200 based on the amount of change $T_{in}$ in temperature determined by the temperature control unit 330, and flows the cooling water into the cooling pipe of the gradient magnetic-field coil 20 (Step S105).

In this way, the coil-dedicated chiller 300 changes the amount of change $T_{in}$ in temperature of cooling water to be flowed into the cooling pipe of the gradient magnetic-field coil 20 in accordance with the amount of change $T_{out}$ in temperature of cooling water flowing out from the cooling pipe of the gradient magnetic-field coil 20, thereby being capable to stabilize the temperature of the gradient magnetic-field coil 20.

Figure 7:
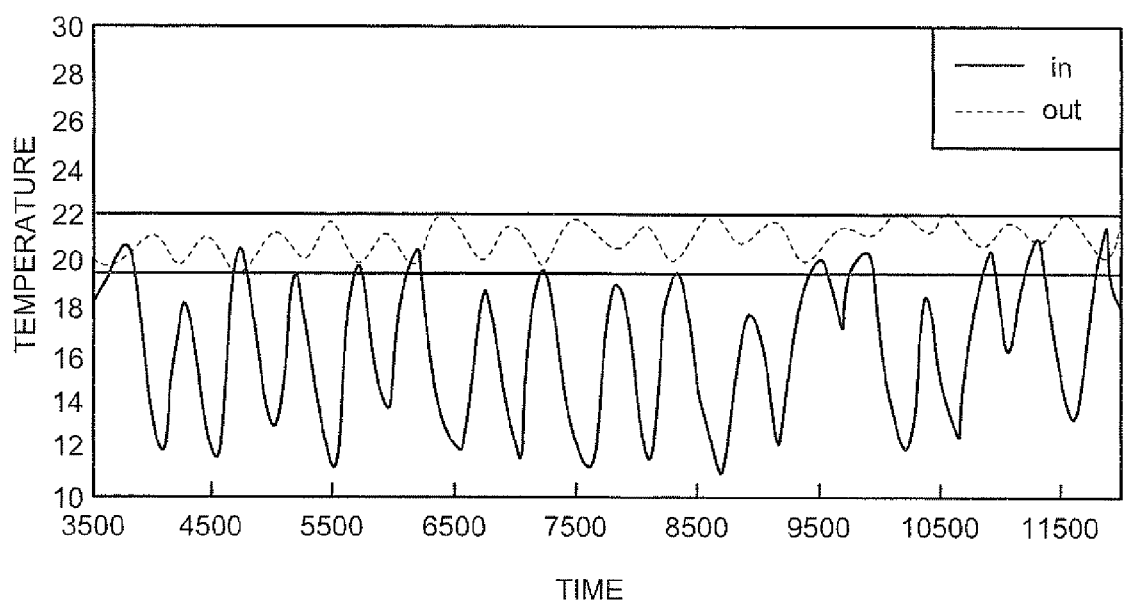
FIG. 7 is a schematic diagram that depicts temperature variations of the gradient magnetic-field coil according to the first embodiment.

FIG. 7 is a schematic diagram that depicts temperature variations of the gradient magnetic-field coil 20 according to the first embodiment. The figure is a graph that depicts variations in the temperature (out) of cooling water flowing out from the cooling pipe of the gradient magnetic-field coil 20 and variations in the temperature (in) of cooling water to be flowed into the gradient magnetic-field coil 20 according to the first embodiment, and the vertical axis indicates the temperature, and the horizontal axis indicates the time. It is assumed that the temperature of cooling water supplied from the main chiller 200 is set to approximately 20° C.

As shown in the figure, according to the first embodiment, when the temperature of cooling water flowing out from the cooling pipe of the gradient magnetic-field coil 20 rises, the temperature of cooling water to be flowed into the cooling pipe of the gradient magnetic-field coil 20 is decreased from 20° C. in accordance with an amount of the rise. By contrast, when the temperature of cooling water flowing out from the cooling pipe of the gradient magnetic-field coil decreases, the temperature of cooling water to be flowed into the cooling pipe of the gradient magnetic-field coil 20 is raised in accordance with an amount of the decrease.

As a result, as shown in the figure, it is observed that the temperature of cooling water flowing out from the cooling pipe of the gradient magnetic-field coil 20 is suppressed between 20° C. and 22° C. Behavior of the temperature of cooling water flowing out from the cooling pipe of the gradient magnetic-field coil 20 substantially agrees with temperature variations of the iron shims 25. This means that variations in the temperature of the iron shims 25 are suppressed between 20° C. and 22° C. according to the first embodiment.

As described above, according to the first embodiment, in the coil-dedicated chiller 300, the temperature-change measuring unit 320 measures the amount of change in temperature of cooling water flowing out from the cooling pipe of the gradient magnetic-field coil 20 by using the temperature monitor 310. The temperature control unit 330 then determines the amount of change in temperature of cooling water to be flowed into the cooling pipe in accordance with the amount of change in temperature of the cooling water measured by the temperature-change measuring unit 320. The temperature adjusting unit 340 then changes the temperature of cooling water to be flowed into the cooling pipe of the gradient magnetic-field coil 20 based on the amount of change in temperature determined by the temperature control unit 330. Accordingly, according to the first embodiment, variations in the temperature of the iron shims 25 can be suppressed without changing the flow rate of a coolant to be flowed in to the cooling pipe.

Moreover, according to the first embodiment, the MRI apparatus 100 includes the main chiller 200 that circulates cooling water in a cooling pipe provided to each unit that needs to be cooled among various units included in the MRI apparatus 100, and the temperature adjusting unit 340 changes the temperature of cooling water to be flowed from the main chiller 200 into the cooling pipe of the gradient magnetic-field coil 20. Accordingly, according to the first embodiment, variations in the temperature of the iron shims 25 can be suppressed without exerting influence on any other unit.

Second Embodiment

The first embodiment is explained above in a case where the coil-dedicated chiller 300 is placed in a machine room, and cooling water supplied from the main chiller 200 placed outdoors is flowed into the cooling pipe of the gradient magnetic-field coil 20. However, the present invention is not limited to this.

For example, if the machine room does not have a space wide enough to place a coil-dedicated chiller, the coil-dedicated chiller can be placed outdoors, and can be configured to flow cooling water from its own device into the cooling pipe of the gradient magnetic-field coil, instead of flowing cooling water supplied from the main chiller into the cooling pipe of the gradient magnetic-field coil.

A case of such configuration is explained below as a second embodiment. For convenience of explanations, devices and functional units that work similarly to the devices and the functional units explained in the first embodiment are assigned with the same reference numerals in the second embodiment, and detailed explanations of them are omitted.

Figure 8:
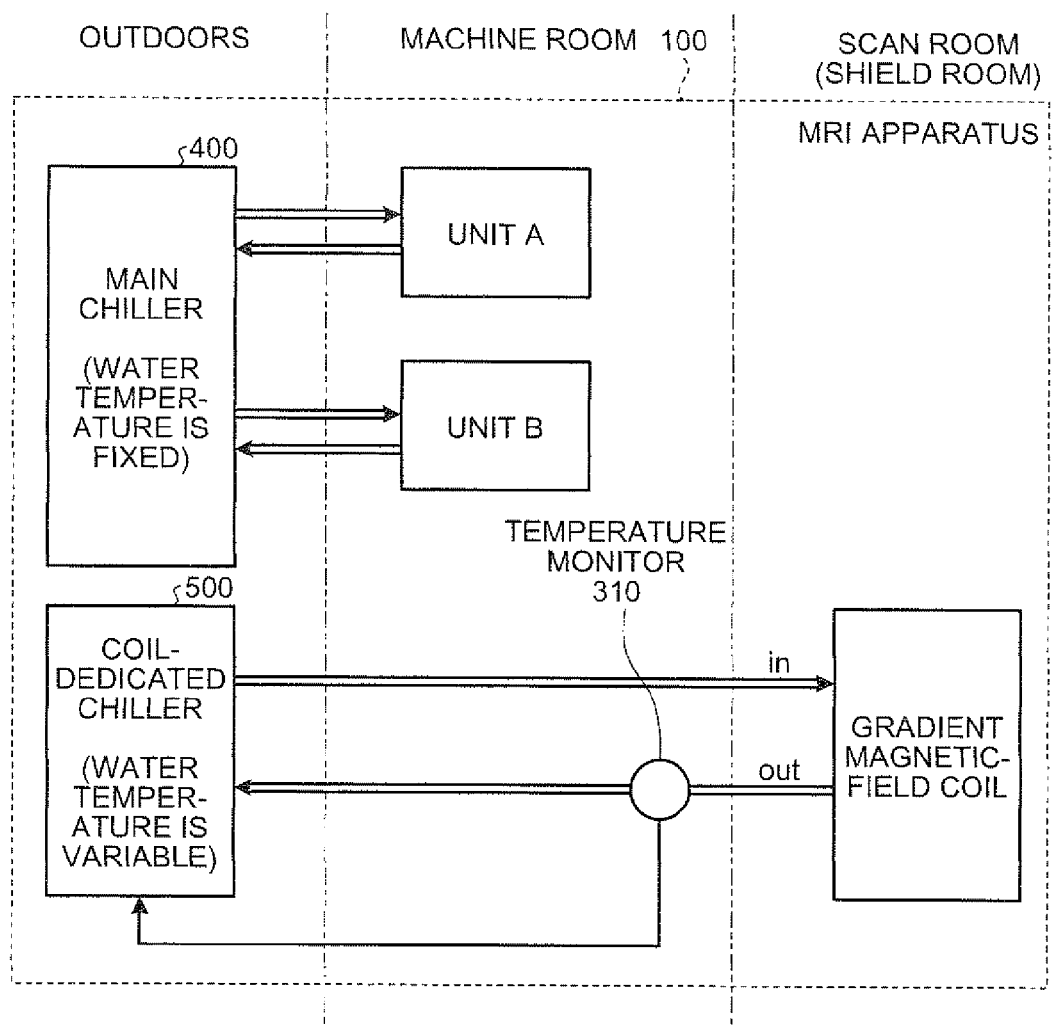
FIG. 8 is a schematic diagram for explaining cooling of units of an MRI apparatus according to a second embodiment.

FIG. 8 is a schematic diagram for explaining cooling of units of an MRI apparatus according to the second embodiment. As shown in the figure, according to the second embodiment, the gradient magnetic-field coil is placed in the scan room (shield room); the unit A and the unit B are placed in the machine room; and a main chiller 400 and a coil-dedicated chiller 500 are placed outdoors.

The main chiller 400 is a device that circulates cooling water in cooling pipes provided to the unit A and the unit B included in the MRI apparatus 100. The main chiller 400 circulates cooling water at a constant temperature (for example, 20° C.) through the cooling pipe of each unit.

The coil-dedicated chiller 500 is a device that is connected to a cooling pipe provided to the gradient magnetic-field coil included in the MRI apparatus 100, and circulates cooling water in the cooling pipe. The coil-dedicated chiller 500 basically has a configuration similar to that of the coil-dedicated chiller 300 shown in FIG. 5; however, it is only different in a point that the temperature adjusting unit 340 flows cooling water from its own device into the cooling pipe of the gradient magnetic-field coil, instead of flowing cooling water supplied from the main chiller into the cooling pipe of the gradient magnetic-field coil.

According to the second embodiment, similarly to the first embodiment, the coil-dedicated chiller 500 includes the temperature monitor 310, and is configured to measure the amount of change in temperature of cooling water flowing out from the cooling pipe of the gradient magnetic-field coil ("out" shown in the figure) by using the temperature monitor 310, and to change the temperature of cooling water to be flowed into the cooling pipe of the gradient magnetic-field coil ("in" shown in the figure) in accordance with the measured amount of change.

In other words, according to the second embodiment, in the coil-dedicated chiller 500 placed outdoors, the temperature-change measuring unit 320 measures the amount of change in temperature of cooling water flowing out from the cooling pipe of the gradient magnetic-field coil, similarly to the first embodiment. The temperature control unit 330 then determines the amount of change in temperature of cooling water to be flowed into the cooling pipe in accordance with the amount of change in temperature of the cooling water measured by the temperature-change measuring unit 320. The temperature adjusting unit 340 then changes the temperature of cooling water to be flowed from its own device into the cooling pipe of the gradient magnetic-field coil based on the amount of change in temperature determined by the temperature control unit 330.

Accordingly, according to the second embodiment, even if the machine room does not have a space wide enough to place the coil-dedicated chiller 500, variations in the temperature of the iron shims 25 can be suppressed without changing the flow rate of a coolant to be flowed in to the cooling pipe, and without exerting influence on any other unit.

Third Embodiment

The first and second embodiments are explained above in a case where the temperature of cooling water to be flowed into the cooling pipe of the gradient magnetic-field coil is change in accordance with the amount of change in temperature of cooling water flowing out from the cooling pipe of the gradient magnetic-field coil. However, the present invention is not limited to this.

For example, the coil-dedicated chiller can be configured to change the temperature of cooling water to be flowed into the cooling pipe of the gradient magnetic-field coil by mixing cooling water supplied from the main chiller with cooling water that is at a constant temperature (for example, 10° C.) lower than the cooling water supplied from the main chiller.

A case of such configuration is explained below as a third embodiment. For convenience of explanations, devices and functional units that work similarly to the devices and the functional units explained in the first and second embodiments are assigned with the same reference numerals in the third embodiment, and detailed explanations of them are omitted.

Figure 9:
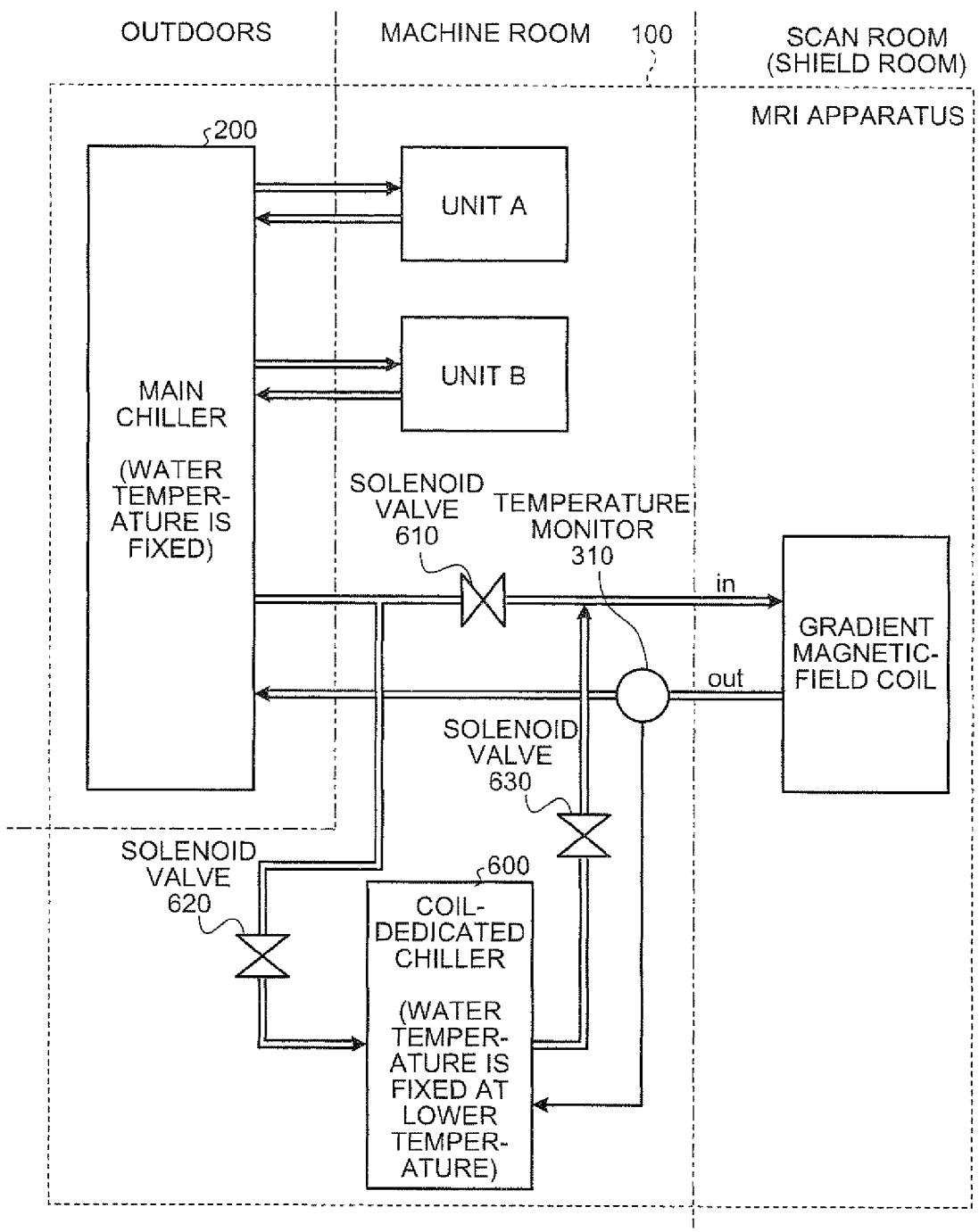
FIG. 9 is a schematic diagram for explaining cooling of units of an MRI apparatus according to a third embodiment.

FIG. 9 is a schematic diagram for explaining cooling of units of an MRI apparatus according to the third embodiment. As shown in the figure, according to the third embodiment, the gradient magnetic-field coil is placed in the scan room (shield room); the unit A, the unit B, and a coil-dedicated chiller 600 are placed in the machine room; and the main chiller 200 is placed outdoors.

The main chiller 200 is a device that circulates cooling water in the cooling pipes provided to the gradient magnetic-field coil, the unit A, and the unit B included in the MRI apparatus 100. The main chiller 200 flows cooling water at a constant temperature (for example, 20° C.) into the gradient magnetic-field coil, the unit A, and the unit B. The main chiller 200 circulates cooling water via a solenoid valve 610 into the cooling pipe of the gradient magnetic-field coil.

The coil-dedicated chiller 600 is a device that is connected to the cooling pipe provided to the gradient magnetic-field coil included in the MRI apparatus 100, and circulates cooling water in the cooling pipe. The coil-dedicated chiller 600 partially takes-in cooling water being flowed from the main chiller 200 into the cooling pipe of the gradient magnetic-field coil upstream from the solenoid valve 610 via a solenoid valve 620, and cools the taken-in cooling water to a constant temperature (for example, 10° C.) lower than the temperature of the cooling water supplied by the main chiller 200. The coil-dedicated chiller 600 then mixes the cooling water cooled to the constant temperature via a solenoid valve 630 with the cooling water that is supplied from the main chiller 200 and has passed through the solenoid valve 610.

According to the third embodiment, in the coil-dedicated chiller 600 configured as described above, when mixing the cooling water cooled to the constant temperature with the cooling water having passed through the solenoid valve 610, the temperature adjusting unit 340 controls the extent of opening and closing of the solenoid valves 610, 620, and 630 in accordance with the amount of change in temperature of cooling water flowing out from the cooling pipe of the gradient magnetic-field coil.

Specifically, when the temperature of the cooling water flowing out from the cooling pipe of the gradient magnetic-field coil rises, the temperature adjusting unit 340 closes the solenoid valve 610 to an extent appropriate to an amount of the rise, and opens the solenoid valves 620 and 630 to the same extent. Accordingly, the proportion of the cooling water supplied from the coil-dedicated chiller 600 is increased in mixed water of the cooling water supplied from the main chiller 200 and the cooling water supplied from the coil-dedicated chiller 600, as a result, the temperature of cooling water to be flowed into the cooling pipe of the gradient magnetic-field coil is decreased.

By contrast, when the temperature of the cooling water flowing out from the cooling pipe of the gradient magnetic-field coil decreases, the temperature adjusting unit 340 opens the solenoid valve 610 to an extent appropriate to an amount of the decrease, and closes the solenoid valves 620 and 630 to the same extent. Accordingly, the proportion of the cooling water supplied from the coil-dedicated chiller 600 is decreased in the mixed water of the cooling water supplied from the main chiller 200 and the cooling water supplied from the coil-dedicated chiller 600, as a result, the temperature of cooling water to be flowed into the cooling pipe of the gradient magnetic-field coil is raised.

In this way, according to the third embodiment, the temperature adjusting unit 340 changes the temperature of cooling water to be flowed into the cooling pipe of the gradient magnetic-field coil by mixing the cooling water to be flowed from the main chiller 200 into the cooling pipe with cooling water at a temperature lower than that of the cooling water from the main chiller 200, thereby instantly changing the temperature of cooling water, so that responsiveness of temperature change of cooling water to variations in the temperature of the gradient magnetic-field coil can be improved.

Magnets, such as the static magnetic-field magnet 10 and the gradient magnetic-field coil 20 are usually placed in the shield, room not to be influenced by an RF signal from the outside. On the other hand, according to each of the first, second, and third embodiments, as shown in each of FIGS. 1, 8, and 9, the temperature monitor 310 is placed outside the shield room (scan room). In this way, as the temperature monitor 310 is placed outside the shield room, it can avoid causing an error in detection of temperature due to the influence of the static magnetic-field magnet 10 or the gradient magnetic-field coil 20.

Figure 10:
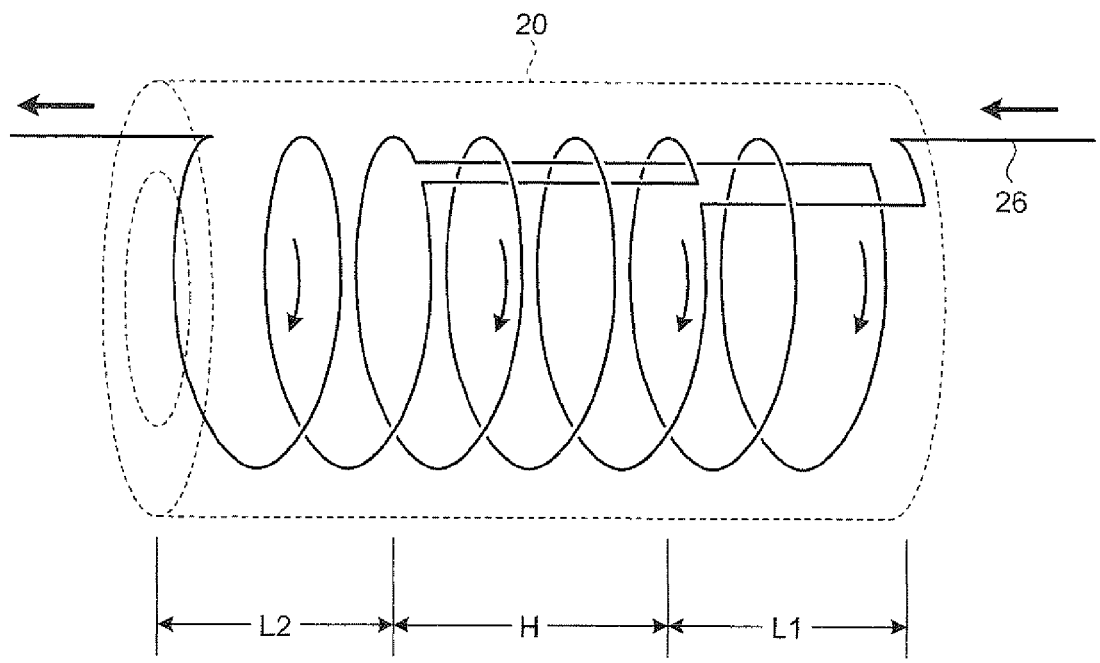
FIG. 10 is a schematic diagram for explaining a case where cooling water is first circulated in a section in which large heat generation occurs.

According to the first, second, and third embodiments, the route of a flow of cooling water inside the gradient magnetic-field coil 20 is not particularly mentioned. However, for example, if the gradient magnetic-field coil 20 includes a section in which large heat generation occurs and a section in which small heat generation occurs, it can be configured to circulate cooling water in the section in which large heat generation occurs prior to the section in which small heat generation occurs. FIG. 10 is a schematic diagram for explaining a case where cooling water is first circulated in a section in which large heat generation occurs.

Generally, the gradient magnetic-field coil 20 generates heat more in a section close to the center of the drum than in sections close to the both ends. For example, it is assumed in the gradient magnetic-field coil 20 shown in FIG. 10 that heat generation in a heat-generating section H that is close to the center of the drum is larger than heat generation in heat-generating sections L1 and L2 that are close to the both ends of the drum. In such case, for example, as shown in FIG. 10, in the gradient magnetic-field coil 20, the cooling pipe 26 is arranged such that cooling water supplied from the chiller flows in from an end of the drum, flows through the heat-generating section H, the heat-generating section L1, and the heat-generating section L2 in order, and then flows out from the other end of the drum.

By arranging the cooling pipe 26 in this way, cooling water supplied from the chiller flows through a section in which small heat generation occurs after flowing through a section in which large heat generation occurs. In other words, cooling water flows through a section in which large heat generation occurs at the lowest water temperature. Accordingly, when the gradient magnetic-field coil 20 includes a section in which large heat generation occurs and a section in which small heat generation occurs, the gradient magnetic-field coil 20 can be more efficiently cooled.

Figure 11:
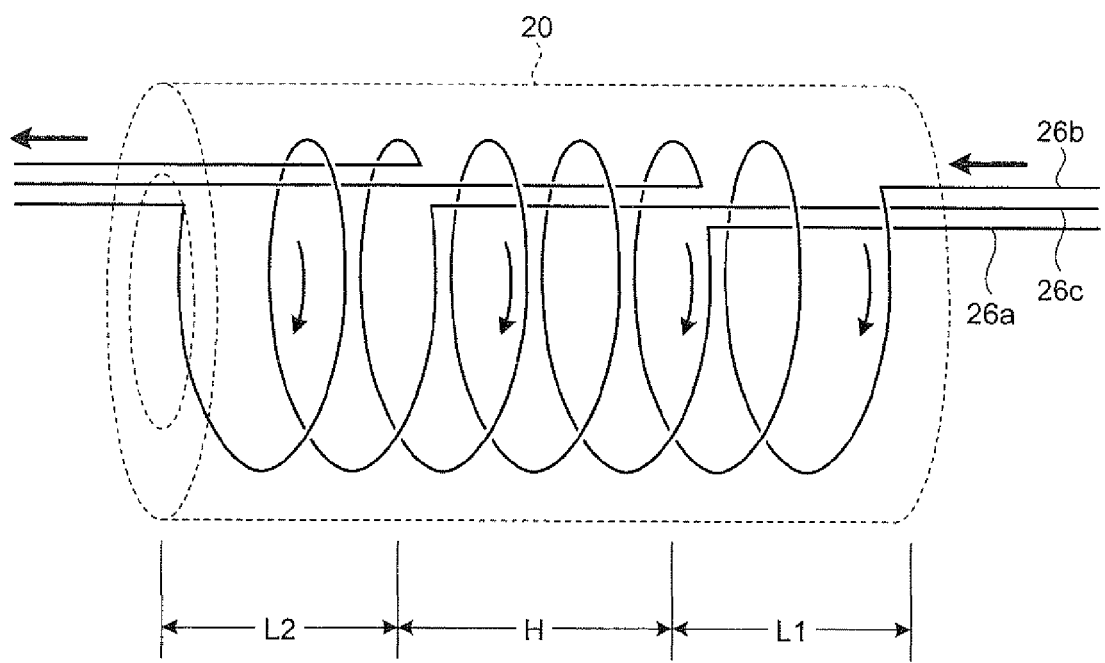
FIG. 11 is a schematic diagram for explaining a case where each heat-generating section is provided with a cooling pipe.
Figure 12:
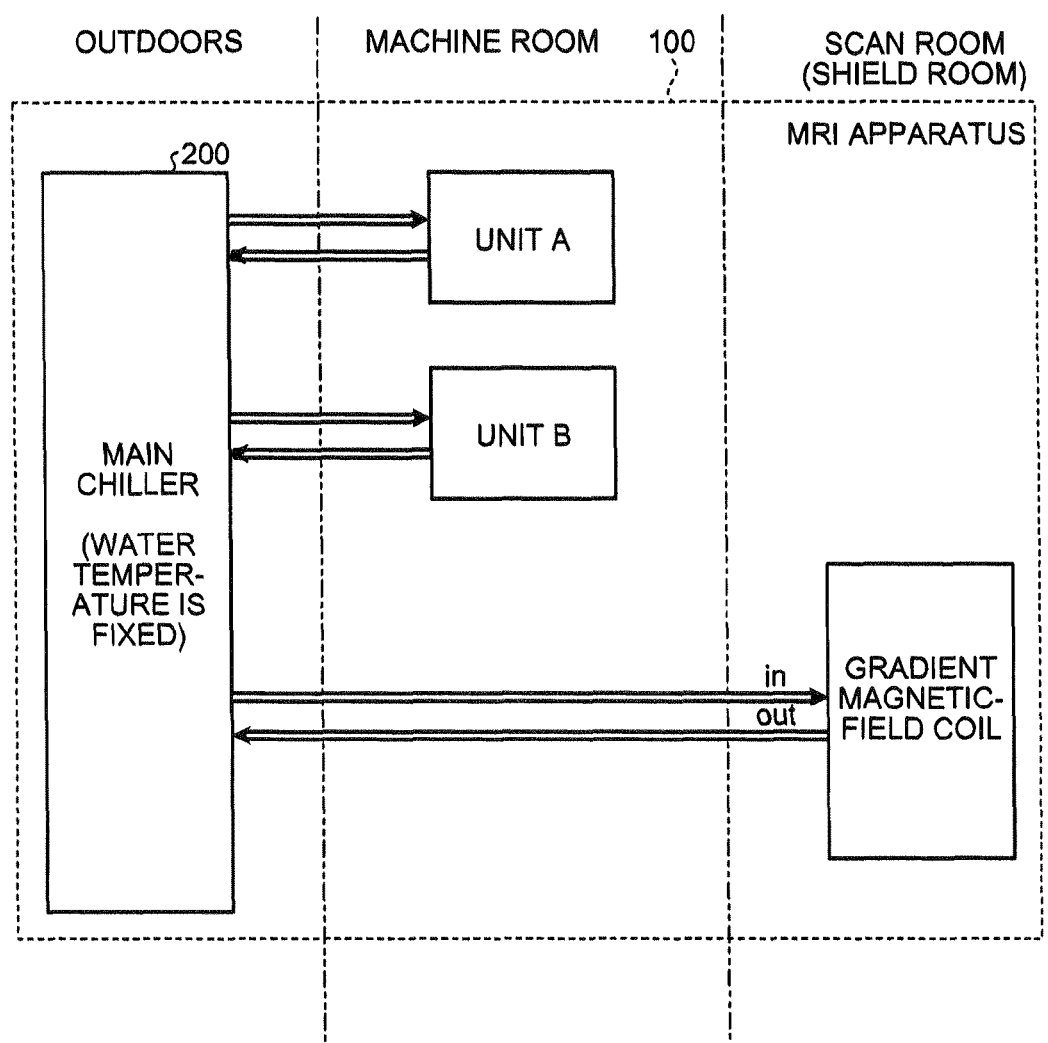
FIG. 12 is a schematic diagram for explaining cooling of units of an MRI apparatus according to a conventional technology.

Although FIG. 10 is explained above in a case of one piece of the cooling pipe 26 via which cooling water is circulated through the heat-generating section H, the heat-generating section L1, and the heat-generating section L2; for example, each of the heat-generating sections can be provided with a cooling pipe. FIG. 11 is a schematic diagram for explaining a case where each heat-generating section is provided with a cooling pipe. For example, as shown in FIG. 11, the gradient magnetic-field coil 20 is provided with cooling pipes 26a, 26b, and 26c. The cooling pipe 26a allows cooling water to circulate through the heat-generating section H; the cooling pipe 26b allows cooling water to circulate through the heat-generating section L1; and the cooling pipe 26c allows cooling water to circulate through the heat-generating section L2.

Furthermore, the gradient magnetic-field coil 20 is provided with a plurality of temperature monitors. Each of the temperature monitors then individually detects the temperature of cooling water flowing out from each of the cooling pipes 26a, 26b, and 26c. The temperature-change measuring unit 320 then measures each amount of change in temperature of cooling water with respect to each of the cooling pipes, based on each temperature of cooling water detected by each of the temperature monitors.

The temperature control unit 330 determines each amount of change in temperature of cooling water to be flowed into each of the cooling pipes 26a, 26b, and 26c, in accordance with each amount of change in temperature of the cooling water measured by the temperature-change measuring unit 320 with respect to each of the cooling pipes. The temperature adjusting unit 340 then changes individually each temperature of cooling water to be flowed into each of the cooling pipes 26a, 26b, and 26c, in accordance with each amount of change in temperature determined by the temperature control unit 330 with respect to each of the cooling pipes.

In this way, when the gradient magnetic-field coil 20 includes a plurality of heat-generating sections, by individually changing each temperature of cooling water to be flowed into each of the heat-generating sections, variations in the temperature of the gradient magnetic-field coil 20 can be more efficiently suppressed in accordance with a change in temperature of each section.

As described above, according to the first, second, and third embodiments, variations in the temperature of the iron shims can be suppressed without changing the flow rate of a coolant to be flowed into the cooling pipe, consequently, variations in the center frequency can be suppressed, and an image of stable quality can be obtained.

Among known technologies, for example, there is a technology that the temperature of cooling water is changed by controlling ON/OFF of a freezer compressor of a chiller based on an inlet temperature of a cooling circulation channel in which a coolant flows. In contrast, the MRI apparatus 100 described above measures the amount of change in temperature per unit of time of a coolant flowing out from the gradient magnetic-field coil 20, and then changes the temperature of cooling water flowing into the gradient magnetic-field coil in accordance with the measured amount of change per unit time, thereby more flexibly coping with variations in the temperature of the gradient magnetic-field coil.

As described above, the magnetic resonance imaging apparatus and the chiller according to the present exemplary embodiment is useful when cooling a unit by circulating a coolant in a cooling pipe, and particularly suitable when cooling a gradient magnetic-field coil that generates heat in accordance with a pulse sequence during a scan.

The invention claimed is:

1. A magnetic resonance imaging apparatus comprising:
   a gradient magnetic-field coil that applies a gradient magnetic field to a subject placed in a static magnetic field,
   a chiller that circulates a coolant at least in the gradient magnetic-field coil,
   a temperature-change measuring unit that measures a temperature versus time gradient representing an amount of change in temperature per unit of time of a coolant flowing out from the gradient magnetic-field coil,
   a temperature control unit that determines an amount of change in temperature of a coolant flowing into the gradient magnetic-field coil in accordance with the temperature versus time gradient of the coolant measured by the temperature-change measuring unit, and
   a temperature adjusting unit that changes temperature of a coolant flowing from the chiller into the gradient magnetic-field coil in accordance with the amount of change in temperature determined by the temperature control unit.

2. The magnetic resonance imaging apparatus according to claim 1, wherein the chiller includes
   a first chiller that circulates a coolant in each of the gradient magnetic-field coil and a unit different from the gradient magnetic field; and
   a second chiller that includes the temperature control unit, and changes temperature of a coolant flowing from the first chiller into the gradient magnetic-field coil.

3. The magnetic resonance imaging apparatus according to claim 2, wherein the temperature-change measuring unit is placed outside a shield room in which the gradient magnetic-field coil is placed.

4. The magnetic resonance imaging apparatus according to claim 2, wherein the gradient magnetic-field coil includes a first heat-generating section, and a second heat-generating section that generates heat less than the first heat-generating section, and includes a cooling pipe that circulates the coolant in the coil so as to circulate through the second heat-generating section after circulating through the first heat-generating section.

5. The magnetic resonance imaging apparatus according to claim 2, wherein the temperature adjusting unit that changes temperature of a coolant flowing into the gradient magnetic-field coil by mixing a coolant supplied from the first chiller with a coolant that is at a temperature lower than a temperature of the coolant supplied from the first chiller.

6. The magnetic resonance imaging apparatus according to claim 5, wherein the first chiller circulates a coolant in the gradient magnetic-field coil via the second chiller.

7. The magnetic resonance imaging apparatus according to claim 6, wherein the temperature-change measuring unit is placed outside a shield room in which the gradient magnetic-field coil is placed.

8. The magnetic resonance imaging apparatus according to claim 6, wherein the gradient magnetic-field coil includes a first heat-generating section, and a second heat-generating section that generates heat less than the first heat-generating section, and includes a cooling pipe that circulates the coolant in the coil so as to circulate through the second heat-generating section after circulating through the first heat-generating section.

9. The magnetic resonance imaging apparatus according to claim 5, wherein the temperature-change measuring unit is placed outside a shield room in which the gradient magnetic-field coil is placed.

10. The magnetic resonance imaging apparatus according to claim 5, wherein the gradient magnetic-field coil includes a first heat-generating section, and a second heat-generating section that generates heat less than the first heat-generating section, and includes a cooling pipe that circulates the coolant in the coil so as to circulate through the second heat-generating section after circulating through the first heat-generating section.

11. The magnetic resonance imaging apparatus according to claim 5, wherein
   the gradient magnetic-field coil includes at least a first heat-generating section and a second heat-generating section, and includes a first cooling pipe that circulates the coolant through the first heat-generating section, and a second cooling pipe that circulates the coolant through the second heat-generating section,
   the temperature-change measuring unit measures an amount of change in temperature per unit of time, with respect to each of a coolant flowing out from the first heat-generating section and a coolant flowing out from the second heat-generating section, the temperature control unit determines an amount of change in temperature of each coolant flowing into each of the first heat-generating section and the second heat-generating section in accordance with each amount of change in temperature of each coolant measured by the temperature-change measuring unit with respect to each heat-generating section, and the temperature adjusting unit changes temperature of each coolant flowing from the chiller into each of the first heat-generating section and the second heat-generating section in accordance with each amount of change in temperature of each coolant determined by the temperature control unit with respect to each heat-generating section.

12. The magnetic resonance imaging apparatus according to claim 2, wherein the first chiller circulates a coolant in the gradient magnetic-field coil via the second chiller.

13. The magnetic resonance imaging apparatus according to claim 12, wherein the temperature-change measuring unit is placed outside a shield room in which the gradient magnetic-field coil is placed.

14. The magnetic resonance imaging apparatus according to claim 12, wherein the gradient magnetic-field coil includes a first heat-generating section, and a second heat-generating section that generates heat less than the first heat-generating section, and includes a cooling pipe that circulates the coolant in the coil so as to circulate through the second heat-generating section after circulating through the first heat-generating section.

15. The magnetic resonance imaging apparatus according to claim 12, wherein
the gradient magnetic-field coil includes at least a first heat-generating section and a second heat-generating section, and includes a first cooling pipe that circulates the coolant through the first heat-generating section, and a second cooling pipe that circulates the coolant through the second heat-generating section,
the temperature-change measuring unit measures an amount of change in temperature per unit of time, with respect to each of a coolant flowing out from the first heat-generating section and a coolant flowing out from the second heat-generating section,
the temperature control unit determines an amount of change in temperature of each coolant flowing into each of the first heat-generating section and the second heat-generating section in accordance with each amount of change in temperature of each coolant measured by the temperature-change measuring unit with respect to each heat-generating section, and
the temperature adjusting unit changes temperature of each coolant flowing from the chiller into each of the first heat-generating section and the second heat-generating section in accordance with each amount of change in temperature of each coolant determined by the temperature control unit with respect to each heat-generating section.

16. The magnetic resonance imaging apparatus according to claim 2, wherein
the gradient magnetic-field coil includes at least a first heat-generating section and a second heat-generating section, and includes a first cooling pipe that circulates the coolant through the first heat-generating section, and a second cooling pipe that circulates the coolant through the second heat-generating section,
the temperature-change measuring unit measures an amount of change in temperature per unit of time, with respect to each of a coolant flowing out from the first heat-generating section and a coolant flowing out from the second heat-generating section,
the temperature control unit determines an amount of change in temperature of each coolant flowing into each of the first heat-generating section and the second heat-generating section in accordance with each amount of change in temperature of each coolant measured by the temperature-change measuring unit with respect to each heat-generating section, and
the temperature adjusting unit changes temperature of each coolant flowing from the chiller into each of the first heat-generating section and the second heat-generating section in accordance with each amount of change in temperature of each coolant determined by the temperature control unit with respect to each heat-generating section.

17. The magnetic resonance imaging apparatus according to claim 1, wherein the temperature-change measuring unit is placed outside a shield room in which the gradient magnetic-field coil is placed.

18. The magnetic resonance imaging apparatus according to claim 1, wherein the gradient magnetic-field coil includes a first heat-generating section, and a second heat-generating section that generates heat less than the first heat-generating section, and includes a cooling pipe that circulates the coolant in the coil so as to circulate through the second heat-generating section after circulating through the first heat-generating section.

19. The magnetic resonance imaging apparatus according to claim 1, wherein
the gradient magnetic-field coil includes at least a first heat-generating section and a second heat-generating section, and includes a first cooling pipe that circulates the coolant through the first heat-generating section, and a second cooling pipe that circulates the coolant through the second heat-generating section,
the temperature-change measuring unit measures an amount of change in temperature per unit of time, with respect to each of a coolant flowing out from the first heat-generating section and a coolant flowing out from the second heat-generating section,
the temperature control unit determines an amount of change in temperature of each coolant flowing into each of the first heat-generating section and the second heat-generating section in accordance with each amount of change in temperature of each coolant measured by the temperature-change measuring unit with respect to each heat-generating section, and
the temperature adjusting unit changes temperature of each coolant flowing from the chiller into each of the first heat-generating section and the second heat-generating section in accordance with each amount of change in temperature of each coolant determined by the temperature control unit with respect to each heat-generating section.

20. A chiller comprising:
a temperature-change measuring unit that measures a temperature versus time gradient representing an amount of change per unit of time of a coolant flowing out from a gradient magnetic-field coil of a magnetic resonance imaging apparatus,
a temperature control unit that determines an amount of change in temperature of a coolant flowing into the gradient magnetic-field coil in accordance with the temperature versus time gradient of the coolant measured by the temperature-change measuring unit, and a temperature adjusting unit that changes temperature of a coolant flowing into the gradient magnetic-field coil in accordance with the amount of change in temperature determined by the temperature control unit, and flows the coolant of which temperature is changed into the gradient magnetic-field coil.

* * * * *